United States Patent [19]
Udd et al.

[11] Patent Number: 5,091,917
[45] Date of Patent: Feb. 25, 1992

[54] METHOD AND APPARATUS FOR PULSE SORTING

[75] Inventors: Richard L. Udd; James C. Robertson, both of Santa Barbara, Calif.

[73] Assignee: Raytheon Company, Lexington, Mass.

[21] Appl. No.: 507,820

[22] Filed: Apr. 12, 1990

[51] Int. Cl.$^5$ .................................. H04B 17/00
[52] U.S. Cl. .................................... 375/10; 455/65; 455/115; 342/44
[58] Field of Search .............. 329/313, 314; 342/42, 342/45, 159, 162; 375/10, 59, 99, 103, 104; 370/91, 93; 455/67, 115

[56] References Cited

U.S. PATENT DOCUMENTS

| | | |
|---|---|---|
| 4,136,340 | 1/1979 | Bishop ............................. 342/45 |
| 4,642,638 | 2/1987 | Callahan, Jr. ..................... 342/45 |
| 4,859,933 | 8/1989 | Taylor et al. .................... 455/115 |

*Primary Examiner*—Benedict V. Safourek
*Attorney, Agent, or Firm*—Richard M. Sharkansky

[57] ABSTRACT

A method and apparatus for associating received pulses with one of a plurality of emitters emitting pulses at periodic intervals. Periodic pulse trains are detected by computing the difference in arrival times between each received pulse and a fixed number of previously received pulses. In the simplest embodiment, a periodic pulse train is detected when one of the computed differences is one-half of another computed difference. In other embodiments, further processing is performed to detect staggered pulse trains or other periodic patterns.

12 Claims, 2 Drawing Sheets

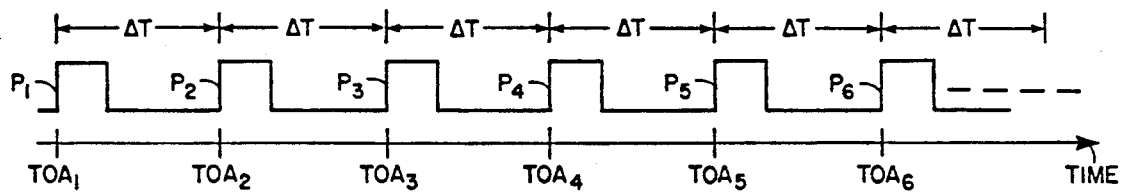
Fig. 2
|  | 1/2 ΔT | ΔT |  | 2ΔT |  | 3ΔT |  | 4ΔT |  | 5ΔT |
|---|---|---|---|---|---|---|---|---|---|---|
|  | $C_1$ | $C_2$ | $C_3$ | $C_4$ | $C_5$ | $C_6$ | $C_7$ | $C_8$ | $C_9$ | $C_{10}$ |
| $r_1$ | 0 | 5 | 0 | 4 | 0 | 3 | 0 | 2 | 0 | 1 |
| $r_2$ |  | 7 |  | 6 |  | 5 |  | 4 |  | 3 |
| $r_3$ |  | $TOA_2$ |  | $TOA_3$ |  | $TOA_4$ |  | $TOA_5$ |  | $TOA_6$ |
| $r_4$ |  | $TOA_3$ |  | $TOA_4$ |  | $TOA_5$ |  | $TOA_6$ |  |  |
| $r_5$ |  | $TOA_4$ |  | $TOA_5$ |  | $TOA_6$ |  |  |  |  |
| $r_6$ |  | $TOA_5$ |  | $TOA_6$ |  |  |  |  |  |  |
| $r_7$ |  | $TOA_6$ |  |  |  |  |  |  |  |  |
| $r_8$ |  |  |  |  |  |  |  |  |  |  |
Fig. 3
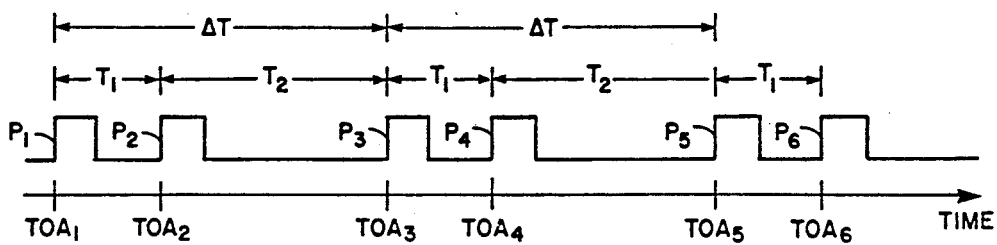
Fig. 4

METHOD AND APPARATUS FOR PULSE SORTING

BACKGROUND OF THE INVENTION

This invention relates generally to signal processing and more particularly to a method of identifying which of a large number of received pulses was emitted by a particular signal source.

In certain signal environments, one receiver may be simultaneously exposed to pulsed signals transmitted by a plurality of signal sources, or "emitters". To obtain the maximum amount of useful information, the receiver must group the received pulses according to their source. This process, sometimes called "pulse sorting", allows the signals from each of the emitters to be processed separately. Such a technique is beneficial because it allows a reduction in the complexity of the processing performed by the receiver. Pulses associated with emitters which provide little information can be ignored. Spurious pulses not associated with any emitter need not be processed.

One known way to accomplish pulse sorting is called "histogramming". This technique takes advantage of the fact that most emitters which transmit pulsed signals transmit pulses at regular intervals. To perform histogramming, the receiver keeps track of the time of arrival of each pulse. For each received pulse, the difference between the time of arrival of that pulse and all preceeding pulses is added to the histogram. As a simple example, if a pulse is received from a particular emitter every 6 seconds, after one minute, the histogram will contain, among other entries, 10 entries associated with the time six seconds. The 10 entries likely represent a local maximum or peak in the histogram. Thus, to identify various emitters, a receiver searches for peaks in the histogram.

One drawback of this approach is that to produce accurate results, the histogram must be constructed from a sufficient number of pulses. Since it takes time to collect the required number of pulses, it takes a correspondingly long time to associate pulses with an emitter using histogramming. Further, some emitters produce pulses at rates up to a thousand times faster than others. Since, in the histogram, the peaks associated with pulses at the higher rate will be much larger than peaks associated with pulses produced at the lower rate, substantial processing is required to identify pulses at the lower rate. Searching through all the entries in the histogram can also require more processing than is desirable in some instances.

SUMMARY OF THE INVENTION

With the foregoing background in mind, it is an object of this invention to provide a computationally simple method of associating a received pulse with one of a plurality of emitters.

It is also an object of this invention to provide a quick method of associating a received pulse with one of a plurality of emitters.

It is a further object of this invention to provide a simple hardware architecture for quickly associating a received pulse with one of a plurality of emitters.

It is a further object of this invention to provide a method of predicting the reception of pulses from selected ones of a plurality of emitters and to perform pulse thinning on the received pulse stream.

It is also an object of this invention to provide a method which allows initiation of the pulse thinning process immediately upon receipt of two pulse repetition interval patterns.

The foregoing and other objects are achieved by a system in which the time of arrival of each pulse is measured and stored in a circular buffer. As each pulse is received, the difference in arrival time between that pulse and each pulse in the circular buffer is computed. These time differences are recorded in a correlation memory. The memory is organized into a plurality of cells, each cell corresponding to a time difference. To record time differences in the memory, the arrival time of the received pulse used to compute the time difference is stored in the cell corresponding to that time difference. A periodic pulse train pattern is identified when one received pulse produces a time difference with a first pulse which is twice the time difference produced with a second pulse.

According to one embodiment of the invention, the system contains a time filter and a plurality of pulse repetition interval trackers For each pulse repetition period associated with an emitter, pulse repetition interval tracker produces a control signal when the next pulse from the emitter is expected. In response to the control signal, a time filter blocks any pulse received at that time from passing into the circular buffer. Rather, the pulse is identified as belonging to the associated emitter and may be sent to an external utilization device.

BRIEF DESCRIPTION OF THE DRAWINGS

For a more complete understanding of this invention, reference is now made to the following more detailed description and accompanying drawings, in which

FIG. 2 is a diagram of a pulse stream;

FIG. 3 is a pictorial representation of information stored in the correlation memory of the system of FIG. 1; and FIG. 4 is a diagram of a staggered pulse stream.

DESCRIPTION OF THE PREFERRED EMBODIMENTS

Figure 1:
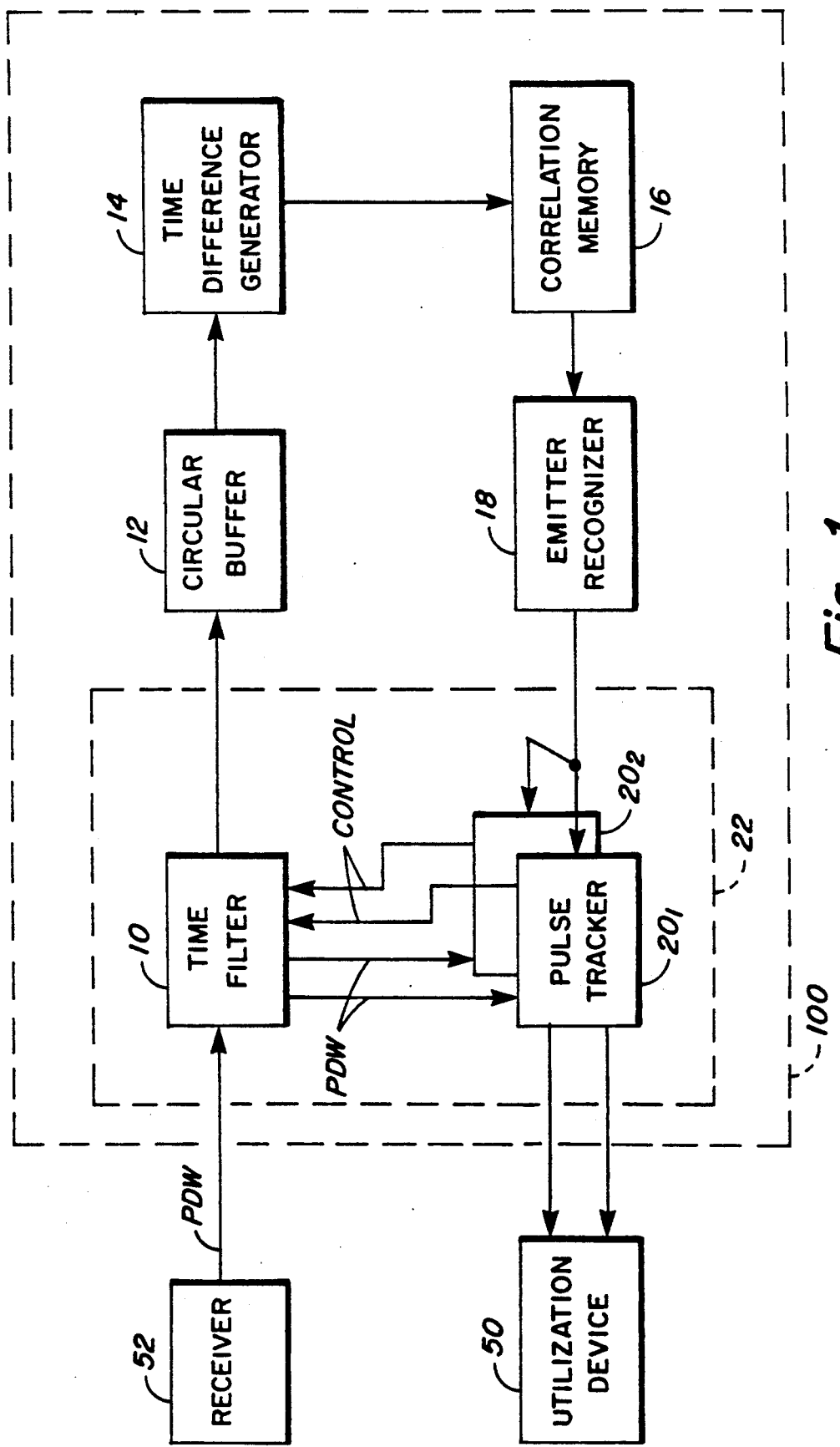
FIG. 1 is a simplified block diagram of a pulse sorting system constructed according to the invention.

FIG. 1 shows a block diagram of a system for sorting pulses according to the present invention. Each block in the diagram represents digital or analog circuitry constructed according to known design techniques for radio systems. One of skill in the art will recognize that standard components, such as power connections and control wiring, are not explicitly shown in FIG. 1. However, such elements are required for proper operation of the system.

Pulses from a plurality of emitters are received by radio receiver 52 which is of known construction. Receiver 52 represents each received pulse by a pulse descriptor word (hereafter "PDW") The PDW is a digital word broken into several fields. One field indicates the time when the pulse is received. Here, the time does not have to be referenced to any absolute time. For example, a digital counter could be used to generate the bits in the time field. Other fields of the PDW could include the frequency of the pulse, the angle of arrival of the pulse, or other information about the pulse commonly used in pulse sorting systems. The specific kinds of information contained in the other fields of the PDW is dictated by the operation of utilization device 50.

In a typical application, numerous emitters transmit pulses periodically. Thus, the output of receiver 52 is a stream of PDWs. This stream of PDWs is fed to pulse thinning circuit 22, the operation of which is described below. Suffice it to say here that pulse thinning circuit 22 eliminates unnecessary PDWs from the stream. The remainder of the PDWs are passed to circular buffer 12.

Circular buffer 12 is a digital memory for storing a fixed number of PDWs. If more than the fixed number of PDWs is written to circular buffer 12, the new PDWs are stored, but the PDWs stored in the buffer the longest are no longer stored. In this way, circular buffer 12 stores the most recent pulses.

Each new PDW is also passed to time difference generator 14. Time difference generator computes the difference between the arrival time of the newly received PDW and all PDWs stored in circular buffer 12. For example, FIG. 2 shows a stream of pulses $P_1 \ldots P_6$ arriving at times $TOA_1 \ldots TOA_6$ spaced uniformly $\Delta T$ apart. When pulse $P_6$ is received, the PDWs for pulses $P_1 \ldots P_5$ are stored in circular buffer 12. Time difference generator 14 computes the time differences. The difference of arrival time between $P_6$ and $P_5$ is $\Delta T$. The difference between $P_6$ and $P_4$ is $2\Delta T$. The differences between $P_6$ and the remaining pulses in circular buffer 12 are computed as $3\Delta T$, $4\Delta T$ and $5\Delta T$.

This information is recorded in correlation memory 16. Correlation memory 16 is a digital memory of known construction. FIG. 3 shows the organization of information stored in correlation memory 16. The memory is divided into Columns $C_1 \ldots C_{10}$ and rows $r_1 \ldots r_8$. Each column corresponds to time difference. For example, Column $C_2$ corresponds to time difference $\Delta T$; Column $C_4$ corresponds to time difference $2\Delta T$; etc. Each column contains a fixed number of rows, here eight rows. The type of information stored in each row is the same in all the columns. Row $r_1$ stores the "hit count". Row $r_2$ stores a pointer to one of the remaining rows $r_3 \ldots r_8$. Rows $r_3 \ldots r_8$ store times of arrival. When time difference generator 14 computes a time difference corresponding to a particular column, the time of arrival of the pulse for which that difference was computed is stored in that column. Each time a time of arrival is stored in a column, the hit count in row $r_1$ of that column is increased by 1. Also, the pointer in row $r_2$ is updated to contain the row number in which the time of arrival was stored.

Considering the pulse stream in FIG. 2 again as an example, when pulse $P_2$ is received, the PDW for pulse $P_1$ is in circular buffer 12. A time difference $\Delta T$ is computed by time difference generator 14. This time difference corresponds to Column $C_2$. Thus, the time of arrival of pulse $P_2$, $TOA_2$, is stored in Column $C_2$. Since that is the first information to be stored in Column $C_2$, it is stored in row $r_3$. The hit count is set to 1 and the pointer is set to contain the number 3, indicating row $r_3$. When pulse $P_3$ is received at $TOA_3$, time difference generator 14 computes time differences $\Delta T$ and $2\Delta T$ since the PDWs for pulses $P_1$ and $P_2$ are in circular buffer 12. These time differences are recorded by storing time $TOA_3$ in Column $C_2$ (corresponding to time $\Delta T$) and Column $C_4$ (corresponding to time $2\Delta T$). The hit count and pointer of each column is likewise updated. After pulse $P_6$ is received, the entries in correlation memory 16 will be as shown in FIG. 3.

The information stored in correlation memory 16 is examined by emitter recognizer 18. Emitter recognizer 18 is constructed from known digital circuit elements and could even be microprocessor. Because of the way information is stored in correlation memory 16, identification of a periodic pulse stream can be relatively easily made. When pulse $P_3$ is received, time $TOA_3$ is stored in column $C_4$ and in Column $C_2$. This information is sufficient for emitter recognizer 18 to identify a pulse stream with a pulse repetition interval of $\Delta T$. The entry $TOA_3$ in Column $C_2$ indicates a pulse, $P_2$, arrived $\Delta T$ before pulse $P_3$. The entry $TOA_3$ in Column $C_4$ indicates another pulse, $P_1$, arrived $2\Delta T$ before pulse $P_3$ or $\Delta T$ before pulse $P_2$. In other words, $P_1$, $P_2$ and $P_3$ are spaced apart by $\Delta T$.

This pattern for recognizing a periodic pulse train can be generalized into a simple algorithm. As each new pulse is received, time difference generator 14 generates the time differences from smallest to largest. This order is simply achieved by comparing the time of arrival of the new pulse to the time of arrival of the pulses in circular buffer 12 in the inverse order in which the pulses in circular buffer 12 were received. As each time difference is generated, it is stored in the appropriate column of correlation memory 16. As each new difference is entered in a column associated with a time difference, emitter recognizer 18 checks the last entry in the column associated with the time difference equal to one half of the time difference being entered. If the time of arrival of that entry "matches" the new difference, then at least two consecutive pulse pattern intervals have been received at a repetition rate equal to one-half of the new difference.

In some instances, knowing that two consecutive pulse pattern intervals with the same spacing have been received is adequate to identify a pulse stream and associate it with an emitter or a type of emitter. In other instances, further processing must be done.

Further processing to identify an emitter type could be performed by examining the other fields of the PDWs associated with the pulses whose times of arrivals produced the matching time differences. Alternatively, more pulses can be received to verify that pulses are being received at the periodic rate exhibited by the matching time differences. For example, if a pulse stream with repetition interval $\Delta T$ is actually being received, when a pulse is received which produces a time difference of $3\Delta T$, it should also produce a time difference of $2\Delta T$ and $\Delta T$. As seen in FIG. 3, there is a match of $TOA_4$ in Columns $C_6$, $C_4$ and $C_2$ corresponding to time differences $3\Delta T$, $2\Delta T$ and $\Delta T$, respectively.

Another way to do further processing is to examine the other entries in the columns where matches are found. For example, once a match is found with a column corresponding to half the time difference, the other entries in that column can be compared to find further matches For example, when pulse $P_5$ is received, $TOA_5$ is recorded in Column $C_4$ corresponding to time difference $2\Delta T$. $TOA_5$ is also recorded in Column $C_2$ corresponding to one half of that time difference (i.e. $\Delta T$). In Columns $C_2$ and $C_4$, there are also matches between $TOA_4$ and $TOA_3$. A total of three matches between the two columns indicates at least five pulses were received at the pulse repetition interval.

Regardless of which method of processing is used to recognize pulse streams, emitter recognizer 18 performs an additional function of associating several pulse streams with the same emitter. Using the above described technique, an emitter producing a pulse stream at a pulse repetition interval of $\Delta T$ will yield "matches" indicating a pulse stream of period $\Delta T$ and multiples of ΔT. Emitter recognizer 18 must associate all of the matches produced by the same pulse stream. For example, Columns $C_8$ and $C_4$ contain matches of $TOA_6$ and $TOA_5$. These matches might indicate a pulse stream with pulse repetition interval 2ΔT. However, these matching arrival times are also found in Column $C_2$, indicating that these pulses are really part of a pulse stream with PRI of ΔT. These matching arrival times are not found in Column $C_1$, indicating that they are not a part of a pulse stream with repetition interval ½ ΔT. Thus, to determine if an identified pulse stream is actually part of a pulse stream with smaller repetition interval, columns corresponding to time differences equal to one-half of the time difference of the column with matches are searched. If matches are found with those columns, then the pulse stream with the larger pulse repetition interval is actually a part of a pulse stream with the smaller repetition interval.

Emitter recognizer 18 also handles the more complicated case of a staggered waveform. FIG. 4 shows an example of a staggered waveform. The time between pulse $P_1$ and $P_2$ is $T_1$ but the time between pulses $P_2$ and $P_3$ is $T_2$. This pattern repeats every ΔT seconds. If emitter recognizer 18 is capable of performing only the functions described above, it will characterize the pulse stream of FIG. 4 as two separate pulse streams with pulse repetition intervals ΔT. These streams would contain pulses $P_1$, $P_3$, $P_5$ . . . and $P_2$, $P_4$, $P_6$ . . . Further processing can be performed on the entries in correlation memory 16 to recognize that these separate pulse streams are part of one staggered pulse stream.

TABLE I shows the entries that could exist in correlation memory 16 after pulses $P_1$ . . . $P_6$ were received. The Table indicates the time differences associated with the various columns rather than the column numbers.

TABLE I

| ROW | \multicolumn{7}{c}{TIME DIFFERENCE} |
|---|---|---|---|---|---|---|---|
| | $T_1$ | $T_2$ | ΔT | $(2T_1 + T_2)$ | $(2T_2 + T_1)$ | 2ΔT | $(3T_1 + 2T_2)$ |
| $r_3$ | $TOA_2$ | $TOA_3$ | $TOA_3$ | $TOA_4$ | $TOA_5$ | $TOA_5$ | $TOA_6$ |
| $r_4$ | $TOA_4$ | $TOA_5$ | $TOA_4$ | $TOA_6$ | | $TOA_6$ | |
| $r_5$ | $TOA_6$ | | $TOA_5$ | | | | |
| $r_6$ | | | $TOA_6$ | | | | |

As shown in Table I, both $TOA_5$ and $TOA_6$ in column 2ΔT have corresponding entries in the column ΔT. As described above, this arrangement of pulses indicates two pulse streams with PRIs of ΔT. To determine whether two or more identified pulse streams are likely to be elements of a single staggered pulse stream, the contents of the higher numbered rows in columns that produce a match are examined by emitter recognizer 18.

When a match was made on $TOA_5$, column ΔT also held times of arrival $TOA_4$ and $TOA_3$. Emitter recognizer 18 computes the difference between each of these additional times of arrival., in order, with the time of arrival that produced the match. In this example, first $TOA_5$ - $TOA_4$ and then $TOA_5$ - $TOA_3$. If the difference is less than the PRI of the pulse stream just identified, the additional TOA is a possible component of a stagger signal. In the example, $TOA_4$ fits this criteria while $TOA_3$ does not because the difference is equal to ΔT, the matching PRI. Once a difference equal to or greater than the matching PRI is found, the process may be stopped since all internal components of a staggered signal must have a spacing of less than the pattern repetition interval and the entries in each row will be at successively earlier times of arrival.

Emitter recognizer 18 next examines the rows in columns 2ΔT, the other column involved in the original match. In the example, $TOA_4$ is not found in this column and the potential stagger match is rejected because not enough pulses have been received. The process is repeated by emitter recognizer 18 after pulse P6 is received. A second regular pulse stream is identified and $TOA_5$ in column ΔT is identified as a possible component of a staggered signal. In this case, $TOA_5$ is also present in column 2ΔT, indicating that it is a part of a pulse stream with the same PRI as the one just identified. The two streams are thus determined to be components of a staggered pulse stream from one emitter. The number of rows in the correlation memory 16 determine how many components of a complex emitter can be identified in two repetitions of the emitter pattern.

The above represents only one, simple embodiment of the process of stagger or patterned emitter recognition using the contents of the correlation memory 16. As in the case of identification of simple, regular pulse streams, the method can be extended to additional received pulses to improve the accuracy of pattern identification. Pulse thinning 22 can employ either a single, simple pulse tracker for each element of a staggered signal, a complex tracker that tracks the complete pattern or any other means that removes the identified pulse stream from the input to the circular buffer 12.

Once emitter recognizer 18 has recognized a pulse stream, it is no longer necessary for more pulses in that stream to be processed. It is even desirable to remove those pulses from the pulse stream processed by emitter recognizer 18. Removing pulses reduces the memory requirements of correlation memory 16 and reduces the required processing speed of emitter recognizer 18.

To eliminate pulses associated with an emitter, emitter recognizer 18 passes information to a pulse tracker. In FIG. 1, two pulse trackers $20_1$ and $20_2$ are shown, but it will be realized that at least one pulse tracker is necessary for each emitter to be recognized. More pulse trackers are necessary for emitters which transmit more complex pulse patterns such as the staggered waveform described above. The information passed to pulse tracker $20_1$ describes the pattern associated with an emitter. It also indicates arrival time of the last pulse from that emitter. This information allows pulse tracker $20_1$ to predict the times when the next pulse from the same emitter will be received.

Pulse tracker $20_1$ predicts the arrival time of the next pulse from the emitter. At the expected arrival time of the pulse, pulse tracker $20_1$ sends a control signal to time filter 10. In response to the control signal, time filter 10 diverts any pulses received to pulse tracker $20_1$. That pulse is then passed from pulse tracker 20, to utilization device 50 as part of a pulse stream from an identified emitter.

In many practical systems, pulses will not be received at precisely periodic intervals. There is some "jitter" in the times when pulses are transmitted by an emitter. To compensate for jitter, pulse tracker $20_1$ produces a control signal which causes time filter 10 to divert pulses to pulse tracker $20_1$ for a short amount of time before a pulse is expected and for a short amount of time after a pulse is expected. The control signal thus defines a "window" in time. The width of the window depends on how much jitter a particular emitter has.

To set the time window appropriately, pulse tracker $20_1$ starts with an initial window of a fixed duration. The duration has to be large enough to accommodate the maximum amount of jitter expected from any emitter. As each pulse is received, the difference between the arrival time of the pulse and the center of the window is determined. This difference is related to the probability that the pulse actually came from the emitter being tracked by pulse tracker $20_1$. For example, a pulse received in the exact center of the window might be assigned a probability of 100%. A pulse at the very edge of the window might be assigned a probability of 5%. A pulse arriving at some time in between would be assigned a probability inversely proportional to its distance from the center of the window.

The probability assigned to any pulse is an indication if it was transmitted by the emitter whose pulses are predicted by pulse tracker $20_1$ (i.e. an "emitter under track"). If the probability that the pulse is from an emitter under track exceeds a certain threshold, say 95%, that pulse is passed through the time filter 10 and pulse tracker 20, to utilization device 50 as shown in FIG. 1. Conversely, if the probability is below the threshold, the pulse is stored in circular buffer 12. As described above, pulses in circular buffer 12 are processed in an attempt to associate groups of pulses with a particular emitter.

This threshold can be varied in response to the rate at which pulses are received. If pulses are arriving so quickly that utilization device 50 cannot process them all, the threshold could be raised. The pulses that are then diverted to utilization device 50 through pulse trackers $20_1$ and $20_2$ as shown are thus more likely to be associated with a specific emitter. Moreover, fewer pulses will be passed to utilization device 50 through pulse trackers $20_1$ and $20_2$.

As shown in FIG. 1, the system contains two pulse trackers $20_1$ and $20_2$. Thus, the system could keep two emitters under track. More pulse trackers could be included to track more emitters or emitters with more complicated pulse patterns. Time filter 10 must, however, respond to the control signals from all the pulse tracks. Each received pulse is compared by time filter 10 to each control signal from each pulse tracker $20_1$, $20_2$. The probability that the pulse is associated with any emitter under track is computed. This combined probability is compared to the threshold to determine whether the pulse is passed to utilization device 50 through pulse trackers $20_1$ and $20_2$.

It should be noted that signal processor 100 breaks up a pulse stream containing numerous pulse streams into several pulse streams containing fewer pulses. Ideally, each pulse stream would correspond to pulses transmitted by one emitter. However, when pulses are received from many emitters, some of the pulse streams may contain pulses from more than one emitter or pulses from spurious sources. Also, signal processor 100 may not associate all the pulses from one emitter. Therefore, utilization device 50 may perform processing on the pulse streams provided by pulse trackers $20_1$, $20_2$. However, the processing performed on these separate pulse streams produced by pulse tracker is less than the processing which would be required to process the pulse stream from receiver 52. The amount of processing is generally proportional to the square or cube of the number of pulses in the pulse stream. Since the pulse streams from pulse tracker $20_1$ and $20_2$ have much few pulses than the pulse stream directly from receiver 52, use of signal processor 100 simplifies the processing needed in utilization device 50.

Having described one embodiment of this invention, numerous variations could be made. For example, FIG. 3 shows that correlation memory 16 contains a row for a pointer and a row for hit count. The value of the pointer can be determined from the hit count. To reduce the amount of memory required, the pointer or the hit count could be eliminated. Furthermore, both could be eliminated if each column in FIG. 3 were loaded as a stack with the most recently received data occupying the top of the stack. A stack provides the added benefit that only a set number of times of arrival are stored in each column. The most recently received information is always available.

As another variation, the columns in correlation memory 16 need not correspond to equally spaced time differences. As shown in FIG. 3, the value assigned to each successive column increases linearly by $\frac{1}{2} \Delta T$. It may be advantageous to have the values increase logarithmically. In this way, good resolution would be provided for small time differences while less memory would be needed for large time differences.

The circuitry used to construct signal processor 100 might also be varied. A general purpose digital computer could be programmed to perform all of the described functions. However, specially constructed circuitry could equally well be used.

In other variations, the amount of processing performed by emitter recognizer 18 could be varied. As described, emitter recognizer 18 determines that certain pulse streams make up one pulse stream. It also determines the minor periods of a staggered pulse stream. It is not necessary that emitter recognizer 18 perform these functions. It may, in some instances, be desirable for utilization device 50 to perform these functions instead.

Various modifications could also be made to the hardware shown in FIG. 1.

In another processing variation, the length of the window in pulse tracker $20_1$ could be changed adaptively. For example, if pulse tracker $20_1$ consistently identifies pulses with a very high probability, the length of the window could be decreased. Conversely, if pulse tracker $20_1$ identifies pulses with a low probability, indicating a pulse train with large jitter, the length of the window could be increased.

It is felt, therefore, that this invention should be limited only by the spirit and scope of the appended claims.

What is claimed is:

1. Apparatus for associating received pulses with one of a plurality of emitters producing pulses at periodic intervals, said apparatus of the type wherein each one of said pulses is represented by a pulse descriptor word including the arrival time of the pulse, said apparatus comprising:

(a) first means for determining the difference in arrival time of a selected one of said pulses and a plurality of said received pulses received before said selected one of said pulses; and (b) second means for determining if the difference in arrival time between said selected one of said pulses and a previously received one of said pulses is twice the difference in arrival time between said selected one of said pulses and a second previously received pulse, said second previously received pulse being received at a time between the time of reception of the first previously received one of the pulses and said selected one of said pulses.

2. The apparatus of claim 1 wherein the first means comprises:
    (a) a circular buffer for storing a predetermined number of the pulse descriptor words, said circular buffer storing the most recently received pulse descriptor words; and
    (b) an arithmetic logic means for computing the difference between the arrival time in the pulse descriptor word of said selected one of said pulses and the arrival times of each of the pulse descriptor words in the circular buffer.

3. The apparatus of claim 2 wherein the second means comprises:
    (a) a memory, said memory organized into rows and columns, each column representing a time difference and one row with a column storing the arrival time of said selected one of said pulses when the arithmetic logic means computes a time difference represented by the column; and
    (b) recognizer logic means for determining when the same arrival time is stored in two columns, one column representing a time equal to the periodic interval and the second column representing a time equal to twice the periodic interval.

4. The apparatus of claim 3 additionally comprising: time filtering means for selectively, in response to a control signal, diverting the pulse descriptor words of received pulses to the second means or to a utilization device through a pulse tracker.

5. The apparatus of claim 4 additionally comprising: means for providing said control signal for the time filtering means, said time filtering means further comprising means responsive to said control signal for diverting the pulse descriptor words to the utilization device through the pulse tracker at said periodic intervals.

6. The apparatus of claim 4 additionally comprising a plurality of means for generating control signals for the time filtering means.

7. The apparatus of claim 4 additionally comprising a plurality of means for generating said control signals at an interval when one of said pulses i expected from one of said plurality of emitters, said control signal having a first state for a window of time preceding and following the expected arrival time of the one of said pulses.

8. A method for associating received pulses with one of a plurality of emitters producing pulses at periodic intervals, comprising the steps of:
    (a) computing for each of a plurality of received pulses, the difference in arrival times between the pulse and a predetermined number of previously received pulses;
    (b) searching the computed differences for a first difference which is one half of a second computed difference; and
    (c) associating pulses received at said first difference with said one of the plurality of emitters.

9. The method of claim 8 additionally comprising the steps of:
    (a) predicting the arrival times of said received pulses belonging to said one of the plurality of emitters; and
    (b) excluding from the plurality of received pulses those pulses arriving sufficiently close to a predicted arrival time of one of said received pulses.

10. The method of claim 9 wherein the step of identifying pulses further comprises:
    (a) searching the computed differences, when a match is detected between said first difference and one-half of said second difference, for a third difference which is one-quarter of the second difference; and
    (b) selecting as the periodic interval one-quarter of the second difference.

11. The method of claim 9 wherein the step of identifying the pulses further comprises:
    (a) searching the computed differences computed for successively received pulses when a match is detected between the first difference and one-half of the second difference, for a pulse producing:
        (i) a fourth difference equal to the first difference plus the second difference;
        (ii) the first difference; and
        (iii) the second difference.

12. Method for determining the pulse repetition interval of a train of pulses, comprising the steps of:
    (a) computing, for each pulse of said train of pulses, a difference in time between said each pulse and each of a predetermined number of previous pulses of said train of pulses;
    (b) searching the computed differences for a first difference which is one half of a second computed difference; and
    (c) assigning said first difference as the pulse repetition interval of said train of pulses.

* * * * *